(12) United States Patent
Nakayama

(10) Patent No.: US 8,305,730 B2
(45) Date of Patent: Nov. 6, 2012

(54) CAPACITOR AND ITS MANUFACTURING METHOD

(75) Inventor: Masao Nakayama, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/013,148

(22) Filed: Jan. 25, 2011

(65) Prior Publication Data

US 2011/0116210 A1      May 19, 2011

Related U.S. Application Data

(62) Division of application No. 12/013,507, filed on Jan. 14, 2008, now abandoned.

(30) Foreign Application Priority Data

Jan. 15, 2007   (JP) ................... 2007-006104
Mar. 30, 2007   (JP) ................... 2007-092198

(51) Int. Cl.
*H01G 4/06* (2006.01)

(52) U.S. Cl. .............. 361/313; 361/301.2; 361/301.4; 361/311; 361/312; 361/306.1

(58) Field of Classification Search ........... 361/301.2, 361/301.4, 311–313, 321.2, 303–305, 306.1, 361/306.3; 438/238, 239
See application file for complete search history.

(56) References Cited

U.S. PATENT DOCUMENTS

| 4,897,154 A | 1/1990 | Chakravarti et al. |
| 5,206,788 A | 4/1993 | Larson et al. |
| 5,396,095 A | 3/1995 | Wolters et al. |
| 6,097,051 A | 8/2000 | Torii et al. |
| 6,295,195 B1 | 9/2001 | Maejima |
| 6,338,994 B1 | 1/2002 | Torii et al. |
| 6,344,363 B1 | 2/2002 | Shinohara et al. |
| 6,432,767 B2 | 8/2002 | Torii et al. |
| 6,501,112 B1 | 12/2002 | Sashida |
| 6,548,343 B1 | 4/2003 | Summerfelt et al. |
| 6,716,694 B2 * | 4/2004 | Yamada ............... 438/239 |
| 7,528,034 B2 | 5/2009 | Nakayama |

FOREIGN PATENT DOCUMENTS

| JP | 62-040728 | 2/1987 |
| JP | 63-033829 | 2/1988 |
| JP | 05-183106 | 7/1993 |
| JP | 09-162311 | 6/1997 |
| JP | 11-233513 | 8/1999 |
| JP | 2001-203194 | 7/2001 |
| JP | 2001-244426 | 9/2001 |
| JP | 2002-26286 | 1/2002 |
| JP | 2002-043277 | 2/2002 |
| JP | 2003-243625 | 8/2003 |
| JP | 2006-332138 | 12/2006 |
| JP | 2006/332138 | 12/2006 |
| JP | 2007-059705 | 3/2007 |
| JP | 2007-242847 | 9/2007 |
| WO | WO 2006-066261 | 6/2006 |

* cited by examiner

*Primary Examiner* — Nguyen T Ha
(74) *Attorney, Agent, or Firm* — Harness, Dickey & Pierce, P.L.C.

(57) ABSTRACT

A method for manufacturing a capacitor includes the steps of: sequentially laminating, on a substrate, a lower electrode layer, a dielectric layer and an upper electrode layer; forming a patterned mask layer on the upper electrode layer; patterning at least the upper electrode layer and the ferroelectric layer using the mask layer as a mask; removing the mask layer; and conducting a plasma treatment to contact plasma with an exposed surface of the dielectric layer.

8 Claims, 10 Drawing Sheets

CAPACITOR AND ITS MANUFACTURING METHOD

CROSS-REFERENCE TO RELATED APPLICATIONS

This application is a divisional of U.S. patent application Ser. No. 12/013,507 filed on Jan. 14, 2008. This application claims the benefit of Japanese Patent Application No. 2007-6104, filed Jan. 15, 2007 (Patent No. 04492819), and Japanese Patent Application No. 2007-92198, filed Mar. 30, 2007. The disclosures of the above applications are incorporated herein by reference.

BACKGROUND

1. Technical Field

The present invention relates to capacitors and methods for manufacturing the same.

2. Related Art

The manufacturing technology relating to a variety of electronic devices having capacitors inside has evolved in recent years, and the application of those devices to computers, printers and other apparatuses is becoming more active. For example, memory devices formed with ferroelectric capacitors and piezoelectric devices formed with ferroelectric capacitors are highly expected as they are characterized by high-speed operation and low-power consumption.

Capacitors included in electronic devices generally have a structure in which a dielectric layer composed of an inorganic oxide sandwiched between two electrode layers composed of metal. With this structure, a charge may be accumulated, a structural change may be caused by polarization, or a displacement such as extension and contraction may be generated in the dielectric layer through the electrodes. The performance of such capacitors may be decided by the dielectric material, the electrodes, characteristics of their interface and the like. To improve the performance of the capacitors, the characteristic of each of the elements needs to be improved, and damage that may be inflicted on the capacitors during their manufacturing process need to be minimized.

Damage inflicted on capacitors during the manufacturing process may cause phenomenon, such as, an increased leakage current generated between the two electrodes, lowered reliability caused by deterioration of the interface, and the like. In particular, in the step of patterning the capacitors by dry etching, the leakage current may considerably increase because plasma directly acts on the dielectric material. Also, in devices in related art having capacitor structures, the capacitor structures may be covered by a barrier layer such as an aluminum oxide layer in order to improve their characteristics and prevent deterioration (see, for example, Japanese Laid-open Patent Application JP-A-2003-243625).

However, the use of an aluminum oxide film as a barrier layer for capacitors in piezoelectric devices may cause a problem in that displacement and contraction of the dielectric layers are restricted as the film of the barrier layer has a high Young's modulus.

According to the research made by the inventors, it has become clear that a leakage current is mainly generated through running along a side surface of the capacitor, in other words, along a side surface of the ferroelectric layer. It is believed that generation of composition change in the dielectric material caused by dry etching, destruction of the crystallinity of the dielectric material by collision of ions, injection of charges in the plasma into the dielectric material may be the causes of the increase in leakage current along the side surface of the ferroelectric material. Also, in the case of devices having the structure in which the capacitor is covered by a dielectric layer, such as, an aluminum oxide layer, a silicon oxide layer or the like, impurities contained in aluminum oxide or silicon oxide of the dielectric layer and hydrogen generated during the process of forming the dielectric layer reduce the inorganic oxide (dielectric material), which is believed to generate leakage current along the side surface of the ferroelectric layer.

SUMMARY

In accordance with a first embodiment of the invention, a method for manufacturing a capacitor includes the steps of: sequentially laminating, on a substrate, a lower electrode layer, a dielectric layer and an upper electrode layer; forming a patterned mask layer on the upper electrode layer; patterning at least the upper electrode layer and the ferroelectric layer using the mask layer as a mask; removing the mask layer; and conducting a plasma treatment to contact plasma with an exposed surface of the dielectric layer.

In accordance with a second embodiment of the invention, a method for manufacturing a capacitor includes the steps of: forming a lower electrode; forming a dielectric layer composed of a ferroelectric or a piezoelectric above the lower electrode; forming an upper electrode above the dielectric layer; patterning the dielectric layer and the upper electrode; forming a first silicon oxide layer that covers at least a side surface of the dielectric layer; conducting a process with plasma containing oxygen; and forming a second silicon oxide layer above at least the first silicon oxide layer.

In accordance with a third embodiment of the invention, a capacitor includes: a lower electrode; a dielectric layer composed of a ferroelectric or a piezoelectric provided above the lower electrode; an upper electrode provided above the dielectric layer; a first silicon oxide layer that covers at least a side surface of the dielectric layer; a nitride layer provided above the first silicon oxide layer; and a second silicon oxide layer provided above at least the nitride layer.

DESCRIPTION OF EXEMPLARY EMBODIMENTS

Figure 1:
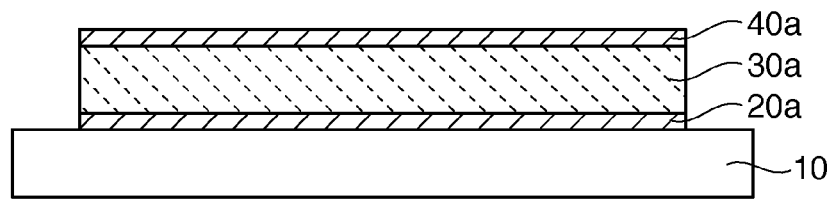
FIG. 1 is a schematic cross-sectional view showing a step of a manufacturing method in accordance with an embodiment of the invention.
Figure 2:
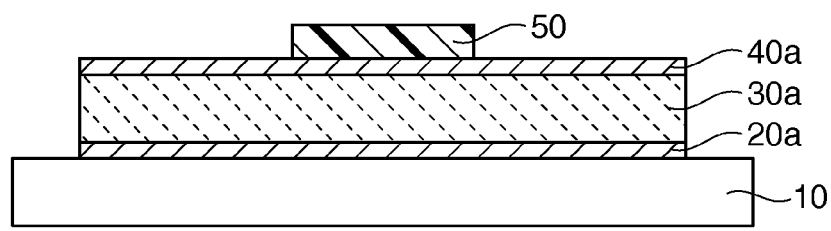
FIG. 2 is a schematic cross-sectional view showing a step of the manufacturing method in accordance with the embodiment of the invention.
Figure 3:
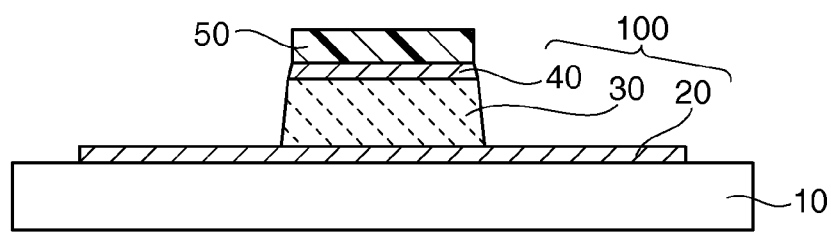
FIG. 3 is a schematic cross-sectional view showing a step of the manufacturing method in accordance with the embodiment of the invention.

In accordance with the invention, there is provided a method for manufacturing a capacitor with reduced damage to its ferroelectric layer and smaller leakage current.

In accordance with the invention, there is provided a capacitor with smaller leakage current, equipped with a barrier layer that controls reduction of inorganic oxide of the dielectric layer and does not harm the characteristics of the dielectric layer, and also a method for readily manufacturing the same.

In accordance with an embodiment of the invention, a method for manufacturing a capacitor includes the steps of: sequentially laminating, on a substrate, a lower electrode layer, a dielectric layer and an upper electrode layer; forming a patterned mask layer on the upper electrode layer; patterning at least the upper electrode layer and the ferroelectric layer using the mask layer as a mask; removing the mask layer; and conducting a plasma treatment to contact plasma with an exposed surface of the dielectric layer.

As a consequence, damage inflicted on the dielectric layer of the capacitor is recovered, and the capacitor with reduced leakage current can be obtained.

In the method for manufacturing a capacitor in accordance with the embodiment described above, the plasma treatment may be conducted at a pressure being 0.26 Pa to 5.0 Pa within a chamber.

In this manner, the damage caused on the dielectric layer of the capacitor can be particularly effectively recovered.

In the method for manufacturing a capacitor in accordance with the embodiment described above, the plasma treatment may be conducted at a pressure being 0.26 Pa to 1.0 Pa within the chamber.

Accordingly, the damage inflicted on the dielectric layer of the capacitor can be further recovered.

In the method for manufacturing a capacitor in accordance with the embodiment described above, the plasma treatment may be conducted, using at least one type selected from $N_2$, Ne and He.

By so doing, the portion of the capacitor being etched by the etching action of the gas can be controlled to a minimum.

In the method for manufacturing a capacitor in accordance with the embodiment described above, the plasma treatment may be conducted, using a gas containing oxygen.

In the method for manufacturing a capacitor in accordance with the embodiment described above, the plasma treatment may be conducted, using a gas containing fluorine.

By so doing, the capacitor can be prevented from being etched, and the damage of the dielectric layer of the capacitor can be more effectively recovered.

In the method for manufacturing a capacitor in accordance with the embodiment described above, a heat treatment may be conducted after the step of conducting the plasma treatment.

In the method for manufacturing a capacitor in accordance with the embodiment described above, a heat treatment may be conducted before the step of conducting the plasma treatment.

By so doing, damage on the dielectric layer related with the leakage current is recovered, and in addition, damage on other parts of the dielectric layer which does not directly affect the leakage current can also be recovered.

The method for manufacturing a capacitor in accordance with the embodiment described above may include, after the step of conducting the plasma treatment, forming an insulation layer on an exposed surface of at least the dielectric layer.

By so doing, after the damage on the exposed surface of the dielectric layer has been recovered by the plasma treatment step, the exposed surface is prevented from contacting the atmosphere, and therefore the reliability of the device can be improved.

In accordance with an embodiment of the invention, a method for manufacturing a capacitor includes the steps of: forming a lower electrode; forming a dielectric layer composed of a ferroelectric or a piezoelectric above the lower electrode; forming an upper electrode above the dielectric layer; patterning the dielectric layer and the upper electrode; forming a first silicon oxide layer that covers at least a side surface of the dielectric layer; conducting a process with plasma containing oxygen; and forming a second silicon oxide layer above at least the first silicon oxide layer.

According to the manufacturing method described above, at least the side surface of the dielectric layer can be covered by the laminate structure formed form the first silicon oxide layer treated with plasma containing oxygen and the second silicon oxide layer. Therefore it is possible to readily obtain a capacitor that has extremely small leakage current and does not harm the characteristic of the dielectric because external influence of impurities is eliminated, and reduction of the inorganic oxide of the dielectric layer is suppressed.

In the method for manufacturing a capacitor according to the embodiment described above, the plasma containing oxygen may further contain nitrogen.

The method for manufacturing a capacitor according to the embodiment described above may include forming a silicon nitride layer at least on the first silicon oxide layer after the step of conducting the plasma treatment, and before the step of forming the second silicon oxide layer.

A capacitor in accordance with an embodiment of the invention includes: a lower electrode; a dielectric layer composed of a ferroelectric or a piezoelectric provided above the lower electrode; an upper electrode provided above the dielectric layer; a first silicon oxide layer that covers at least a side surface of the dielectric layer; a nitride layer provided above the first silicon oxide layer; and a second silicon oxide layer provided above at least the nitride layer.

According to the structure described above, the side surface of the dielectric layer is covered by the laminate structure formed form the first silicon oxide layer, the nitride layer and the second silicon oxide layer, which makes external influence of impurities extremely small, and suppresses the reduction of the inorganic oxide of the dielectric layer, such that the capacitor can be made to have very small leakage current.

The capacitor in accordance with the embodiment described above may further have another silicon nitride layer between the nitride layer and the second silicon oxide layer.

In the capacitor in accordance with the embodiment described above, the nitride layer may include at least one of silicon nitride and silicon oxinitride.

Embodiments of the invention are described below with reference to the accompanying drawings. It is noted that the following embodiments are presented to describe examples of the invention.

1. First Embodiment
1.1. Method for Manufacturing Capacitor

A method for manufacturing a capacitor 100 in accordance with an embodiment of the invention is described below with reference to FIGS. 1 to 5. FIGS. 1 to 5 are cross-sectional views schematically showing the steps of manufacturing the capacitor 100.

The manufacturing method according to the embodiment includes sequentially laminating, on a substrate 10, a lower electrode layer 20a, a dielectric layer 30a and an upper electrode layer 40a, as shown in FIG. 1.

First, the substrate 10 is prepared. The substrate 10 is a base substrate of the capacitor 100, and may be a substrate of inorganic oxide, such as, zirconium oxide, silicon nitride, silicon oxide or the like, a plate body of an alloy such as stainless steel or the like when the capacitor 100 is used for piezoelectric actuators. When the capacitor 100 is used for memory elements, the substrate 10 may be a semiconductor substrate that includes interlayer dielectric layers and wiring layers. Also, the substrate 10 may have a laminate structure of laminated plate bodies in two or more kinds.

Then, the lower electrode layer 20a is stacked on the substrate 10. The lower electrode layer 20a may be formed by, for example, a sputter method, a vapor deposition method or a CVD (chemical vapor deposition) method. The thickness of the lower electrode layer 20a may be 100 nm to 300 nm. The material for the lower electrode layer 20a may be any conductive material without any particular limitation. For example, as the material for the lower electrode layer 20a, a metal such as nickel, iridium, platinum or the like, a conductive oxide of these metals (such as iridium oxide), a complex oxide of strontium and ruthenium, a complex oxide of lanthanum and nickel, or the like. Also, the lower electrode layer 20a may be formed of a single layer of any one of the materials exemplified above, or a laminate structure including a plurality of materials.

Next, the dielectric layer 30a is stacked on the lower electrode layer 20a. For example, the dielectric layer 30a may be formed by a sol-gel method, a CVD method or the like. According to the sol-gel method, a series of steps including coating a source material solution, pre-heating and annealing for crystallization may be repeated several times to obtain a desired film thickness. The thickness of the dielectric layer 30 may be 50 nm to 1500 nm. As the material for the dielectric layer 30a, a perovskite type oxide as represented by a general formula $ABO_3$ (where the element A includes Pb, and the element B includes Zr and Ti) may preferably be used. Above all, lead zirconate titanate (PZT) and lead zirconate titanate niobate (PZTN) are preferable as materials that exhibit the piezoelectricity. Also, a complex oxide of barium, strontium and titanium (BST), and a complex oxide of strontium, bismuth and tantalum (SBT) may be favorably used as the material that exhibits the ferroelectricity.

Then, the upper electrode layer 40a is stacked on the ferroelectric layer 30a. The upper electrode layer 40a may be formed by a sputter method, a vapor deposition method or a CVD method. The thickness of the upper electrode layer 40a may be, for example, 50 nm to 200 nm. The material for the upper electrode layer 40a may be any conductive material without any particular limitation. For example, as the material for the upper electrode layer 40a, a metal such as nickel, iridium, gold, platinum or the like, a conductive oxide of these metals (such as iridium oxide), a complex oxide of strontium and ruthenium, a complex oxide of lanthanum and nickel, or the like may be used. Also, the upper electrode layer 40a may be made of a single layer of any one of the materials exemplified above, or a laminate structure including a plurality of the materials.

In a manner described above, the laminate structure as shown in FIG. 1 is formed. However, the step of annealing the dielectric layer 30a and various surface treatment steps may be added to the process described above.

The manufacturing method according to the present embodiment includes the step of forming a patterned mask layer 50 on the upper electrode layer 40a. The mask layer 50 may be one of those that are used in a known photolithography technique. As the mask layer 50, a hard mask composed of a complex oxide of lanthanum and nickel may be used. Furthermore, the hard mask may be used in combination with a mask used in the photolithography technique.

The manufacturing method in accordance with the present embodiment includes the step of patterning at least the upper electrode layer 40a and the dielectric layer 30a by etching with the mask layer 50 being used as a mask. In this step, the upper electrode layer 40a and the dielectric layer 30a are etched, and the lower electrode 20a may also be etched if necessary. In the example shown in FIG. 3, the state in which the upper electrode layer 40a and the dielectric layer 30a are etched is shown, but the lower electrode layer 20a may further be etched. As the etching method, a dry etching method, a wet etching method or a combination of the aforementioned etching methods may be used. For example, the upper electrode layer 40a may favorably be etched by dry etching with a mixed gas of halogen gas and argon gas, and the dielectric layer 30a with a mixed gas of halogen gas and fluorocarbon gas. When a dry etching method is selected, a common plasma dry etching may be conducted. The plasma dry etching may be conducted with standard conditions, for example, with the pressure being 0.5 Pa, the plasma source power being 1000 W, and the power of the RF bias being 450 W.

The manufacturing method in accordance with the present embodiment includes the step of removing the mask layer 50. The mask layer 50 may be removed by ashing. The ashing may be conducted by a known method. As conditions for the ashing, for example, $O_2$ and $N_2$ may be used as gases for the ashing, the pressure may be 266 Pa, the plasma source power may be 900 W, and the RF bias power may be 0 W.

In the manufacturing method according to the present embodiment, a series of the three steps, i.e., the step of forming the mask layer 50, the step of patterning the upper electrode layer 40*a* and the dielectric layer 30*a*, and the step of ashing may be repeated multiple times.

Figure 4:
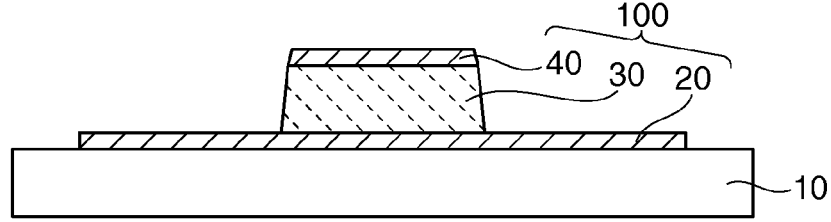
FIG. 4 is a schematic cross-sectional view showing a step of the manufacturing method in accordance with the embodiment of the invention.
Figure 5:
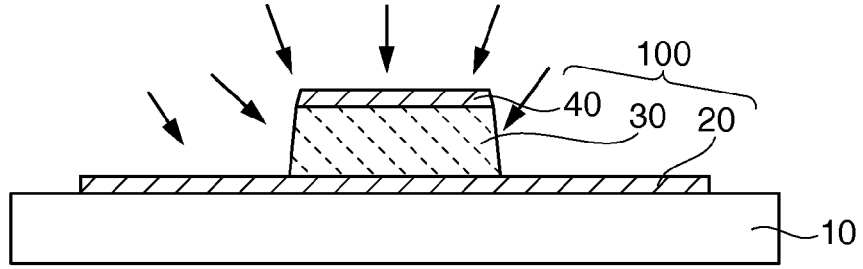
FIG. 5 is a schematic cross-sectional view showing a step of the manufacturing method and a capacitor in accordance with the embodiment of the invention.

The capacitor structure as shown in FIG. 4 is formed in a manner described above. Further, the manufacturing method in accordance with the present embodiment is characterized by a plasma treatment processing (hereafter simply referred to as a "plasma treatment") in which a plasma treatment is conducted with RF bias being applied to the substrate 10, whereby exposed surfaces of the dielectric layer 30 are contacted with plasma. Such a plasma treatment is not generally conducted in prior art. This is because, after completing the step of ashing, a process that requires increasing the degree of vacuum may be required before the capacitor is retrieved from the apparatus that is used for the ashing, as required by the process. However, based on a fining that there is a possibility of damage inflicted on the dielectric near the exposed surface of the dielectric layer 30 that has undergone through the processing up to the ashing step described above, the manufacturing method in accordance with the present embodiment includes the plasma treatment for recovering the damage. The damage refers to, for example, oxygen deficiency caused by the dry etching and charge accumulation generated by the ashing. Furthermore, the dielectric layer 30 may be damaged, even after the ashing step, for example, if a protective film is formed on the capacitor and a surface treatment is conducted to increase the adhesion between the capacitor and the protective film. The plasma treatment in the manufacturing method in accordance with the present embodiment is conducted to recover damage inflicted on the exposed surface of the dielectric layer 30. FIG. 5 schematically shows a state of plasma contacting the exposed surface of the dielectric layer 30 in the present step.

The plasma in the plasma treatment in accordance with the present embodiment may be generated by a known method in a plasma generation apparatus without any particular limitation, including a double-pole discharge type, a magnetron discharge type, and an electrodeless discharge type. Also, the use of helicon wave plasma and inductively coupled plasma (ICP) for the plasma treatment is more favorable as they are high density plasma. The plasma treatment is conducted with a RF bias being applied to the side of the substrate 10. An application of even a small RF bias to the substrate 10 results in favorable plasma treatment. By applying an RF bias to the substrate 10, more plasma particles are drawn in the substrate 10, whereby the recovering effect of the present step is generated. The effective value of the RF bias power changes depending on the area of the substrate 10. For example, when a 6-inch wafer is used for the substrate 10, the power of 50 W or more would be sufficient. However, when the RF bias power is too high, the energy of ions colliding against the substrate may become too large, which enhances the effect of etching the substrate and therefore is not preferable.

In the plasma treatment step in the manufacturing method in accordance with the present embodiment, the lower the pressure in the plasma treatment, the better. In particular, the pressure may preferably be 5 Pa or lower, and more preferably be 1 Pa or lower. A chamber that is suitable for generating the plasma in this pressure range may be freely selected for this step, and the plasma treatment in the present step can be conducted in the chamber.

Also, as the gas to be introduced into the chamber for generating plasma, relatively light gas is preferable such that etching on the dielectric layer 30 would not preferentially occur. Any source gas may be used for the plasma without any particular limitation, and the source gas may preferably be oxygen ($O_2$), nitrogen ($N_2$), nitrous oxide ($N_2O$), nitrogen trifluoride ($NF_3$), helium (He), neon (Ne), argon (Ar), carbon tetrafluoride ($CF_4$), carbon monoxide (CO), or a mixed gas of two or more of the aforementioned gases. Above all, neon and helium are inert and light gases, and particularly preferred as their etching effect to the dielectric layer 30 is low. Also, plasma containing oxygen, which is generated when oxygen, nitrous oxide, or carbon monoxide gas is selected, is preferred in view of their small etching effect as the oxygen in the gas protects the dielectric layer 30 that is composed of oxide. Furthermore, plasma that is generated by a mixed gas containing oxygen and fluorine is particularly preferable as it excels in the effect of recovering damage inflicted on the dielectric layer 30.

As the method for manufacturing a capacitor in accordance with the present embodiment includes the plasma treatment step as described above, damage on the dielectric layer 30 can be recovered, and the capacitor 100 with little leakage current can be provided.

The method for manufacturing a capacitor in accordance with the present embodiment may include the step of conducting a heat treatment before and/or after the plasma treatment described above. Such a heat treatment may be conducted by, for example, a method in which the capacitor together with the substrate is placed inside a diffusion furnace or a RTA (rapid thermal annealing) apparatus, or a method in which electromagnetic wave is irradiated to the substrate. The temperature of the heat treatment may be 500° C. to 1000° C. More specifically, the temperature may preferably be 600° C. to 800° C., for example, for recovering the crystallinity of the dielectric layer 30. By including the heat treatment step described above in the manufacturing method according to the present embodiment, the crystal defects not only on the exposed surface of the dielectric layer 30 but also in its entirety can be recovered.

The method for manufacturing a capacitor in accordance with the present embodiment may further include, after the plasma treatment, the step of forming an insulation film on at least the exposed surface of the dielectric layer 30. As the material for the insulation film, for example, aluminum oxide and silicon oxide are preferable. The thickness of the insulation film is not particularly limited. The insulation film may be formed by, for example, a vapor deposition, sputter or CVD method.

The step of forming the insulation film is conducted after the plasma treatment in accordance with the present embodiment, but its sequence with respect to the heat treatment described above is not particularly limited. This is because, in the plasma treatment, plasma particles need to contact the exposed surface of the dielectric layer 30, but the heat treatment step does not have such a requirement. The plasma treatment according to the present embodiment is more effective when applied directly to the dielectric, and therefore is preferably conducted before the exposed surface of the dielectric is covered by the insulation film and the protection film. On the other hand, the heat treatment is effective either before or after the side wall is covered. Therefore, there is no restriction on the order in conducting the heat treatment and the plasma treatment, but the plasma treatment is preferably conducted before the dielectric is covered.

As the step of forming such an insulation layer is included, the exposed surface is prevented from contacting the atmosphere after the damage on the exposed surface of the dielectric layer 30 is recovered, such that the reliability of the capacitor can be improved. More specifically, the exposed surface of the dielectric layer 30 can be prevented from contacting substances such as reducing gases and water, such that deterioration such as reduction of the dielectric layer 30 becomes difficult to occur, and therefore, for example, the service life of the capacitor can be prolonged.

1.2. Experimental Example

Experimental examples are described below for more concretely describing the method for manufacturing a capacitor in accordance with the present embodiment.

Figure 6:
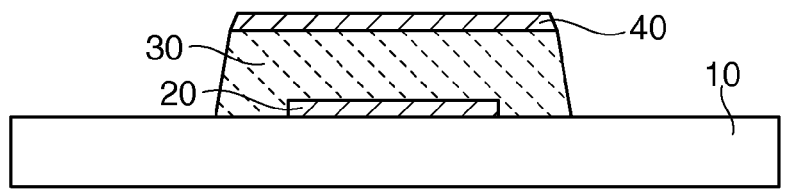
FIG. 6 is a schematic cross-sectional view of the structure of a capacitor in accordance with an experimental example.
Figure 7:
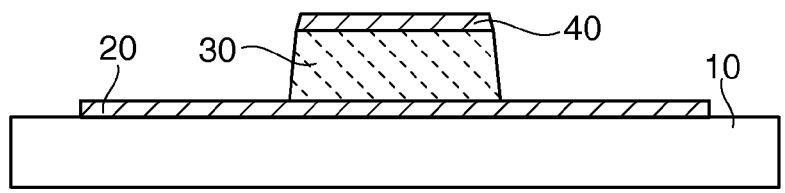
FIG. 7 is a schematic cross-sectional view of the structure of a capacitor in accordance with an experimental example.
Figure 8:
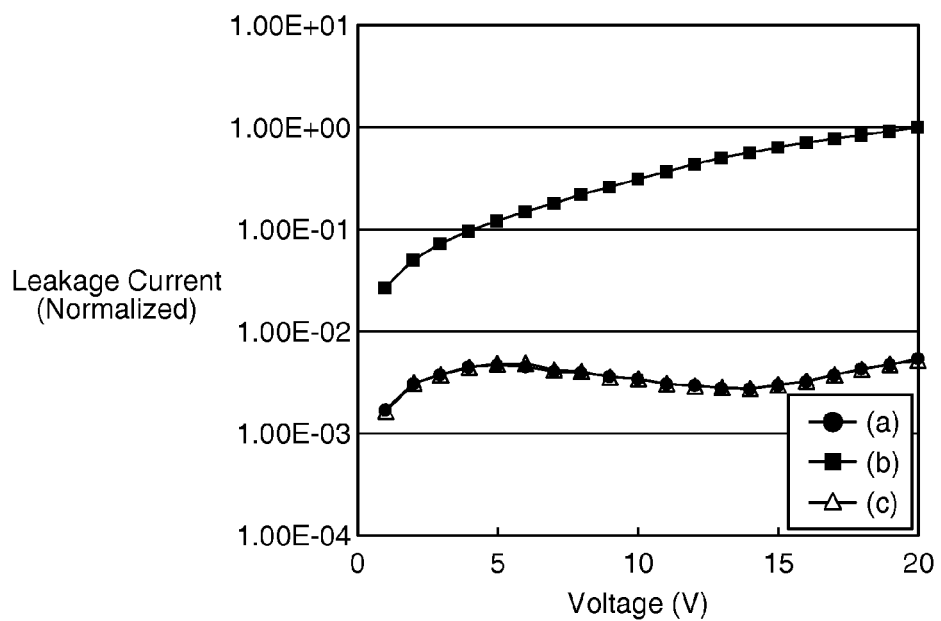
FIG. 8 is a graph showing results of measurement of leakage current.

FIGS. 6 and 7 are cross-sectional views schematically showing the structure of a capacitor used in the present experimental example. According to the structure of the capacitor shown in FIG. 6, the upper electrode 40 is greater than the lower electrode 20, such that the current that runs on the side surface of the dielectric layer 30 gives almost no contribution to the leakage current that flows between the upper electrode 40 and the lower electrode 20. On the other hand, in the capacitor structure shown in FIG. 7, the upper electrode 40 is smaller than the lower electrode 20, which gives a great contribution to the leakage current that runs along the side surface of the dielectric layer 30. FIG. 8 is a graph that compares leakage currents in the capacitors having mutually different structures, as shown in FIG. 6 and FIG. 7. Leakage current values (normalized by a current value of the capacitor structure shown in FIG. 7 measured at a voltage of 20V) are plotted along the axis of ordinates of the graph, and measurement voltages are plotted along the axis of abscissas. Leakage currents of the capacitors having the structure shown in FIG. 6 and the structure shown in FIG. 7 are indicated by (a) and (b) in the graph shown in FIG. 8, respectively, and leakage currents of the capacitor having the structure shown in FIG. 7 and to which the plasma treatment is further applied are indicated by (c) in the graph. The plasma treatment was conducted with the oxygen plasma being at 0.26 Pa, the plasma source power at 900 W, the RF bias power at 50 W, and the treatment time being 10 seconds. PZT was used for the dielectric layer. Comparing the structures shown in FIGS. 6 and 7, it is clear from the graphs that the structure with a greater influence from the side surface of the dielectric layer shown in FIG. 7 has leakage currents about 100 times greater than the other. In other words, it becomes clear that the leakage current increases due to the damage on the side surface of the dielectric layer 30. The degree of increase in the leakage current differs depending on how the side surface is damaged. When the capacitor is processed with the plasma treatment, it is observed that the plotted leakage currents indicated by (c) in the graph generally overlap the plotted leakage currents indicated by (a) of the structure shown in FIG. 6. In other words, it is found that the leakage current that runs on the side surface of the dielectric layer 30 is made extremely small by the plasma treatment.

Figure 9:
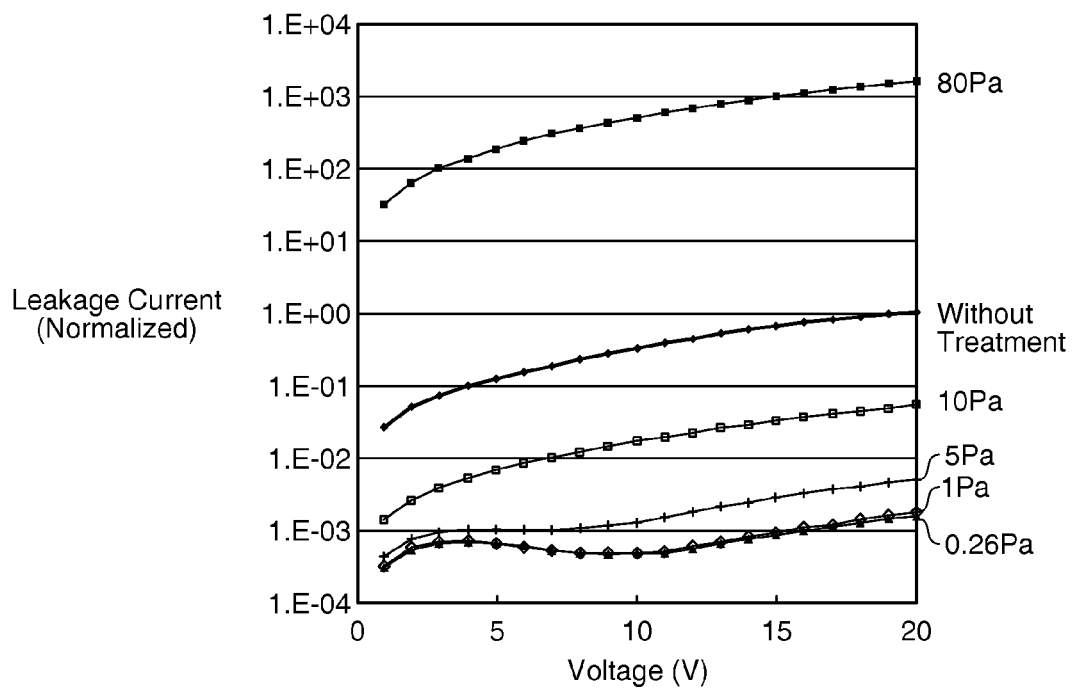
FIG. 9 is a graph showing results of measurement of leakage current.

FIG. 9 shows the effects of the pressure in the plasma treatment which are exerted on the leakage current. In FIG. 9, the axis of ordinates and the axis of abscissas similarly correspond to those in FIG. 8. The plasma treatment with oxygen plasma was applied to capacitors (without being processed by the plasma treatment) in which the side surface of the dielectric layer was damaged in the range of pressures from 0.26 Pa to 80 Pa. From 0.26 Pa to 10 Pa, the other parameters were set as follows: the plasma source power was 900 W, the RF bias power was 50 W, and the treatment time was 20 seconds. At 80 Pa, the other parameters were set as follows: the plasma source power was 300 W, the RF bias power was 200 W, and the treatment time was 20 seconds. Leakage current values are normalized by a current value of a capacitor that is not processed by the plasma treatment which is measured at 20V. Also, FIG. 10 plots leakage current values of capacitors measured at a voltage of 20V after the plasma treatment along the axis of ordinates, and pressures along the axis of abscesses.

Figure 10:
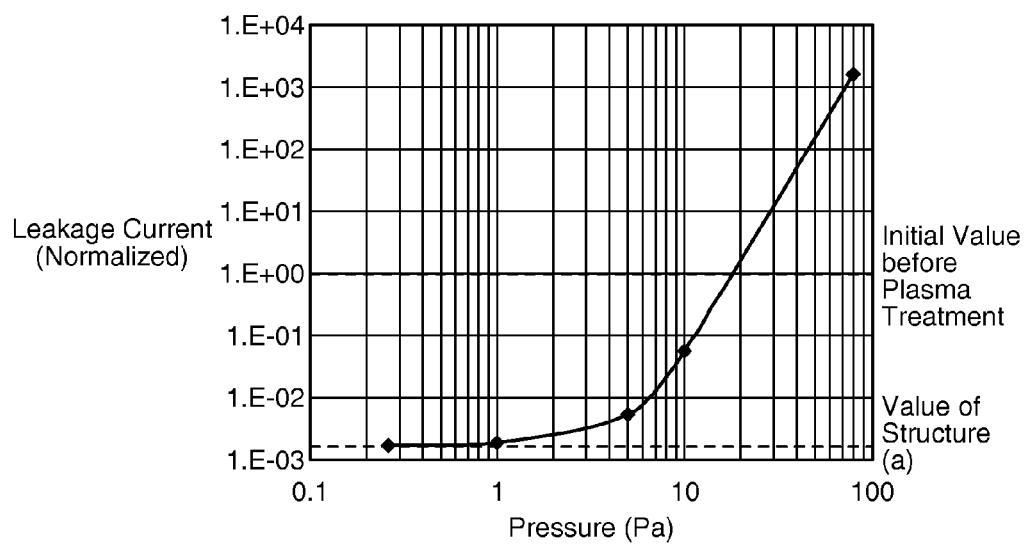
FIG. 10 is a graph showing results of measurement of leakage current.

As is clear from FIGS. 9 and 10, by the plasma treatment at pressures of 20 Pa or lower, it is found that the leakage current of the capacitors becomes smaller, which indicates that the damage on the side surface of the dielectric layer is recovered. The lower the pressure, the greater the effects. In particular, at 5 Pa or lower, the influence of the damage on the side surface of the dielectric layer to the leakage current could be eliminated almost entirely. At 1 Pa or lower, leakage current values that are equivalent to those of the dielectric layers whose damage on the side surface is almost completely recovered could be obtained. On the other hand, at 20 Pa or higher, the side surface of the dielectric layer was damaged, which increased the leakage current. At 80 Pa or higher, the leakage current increased more than 1000 times the value obtained before the plasma treatment.

Figure 11:
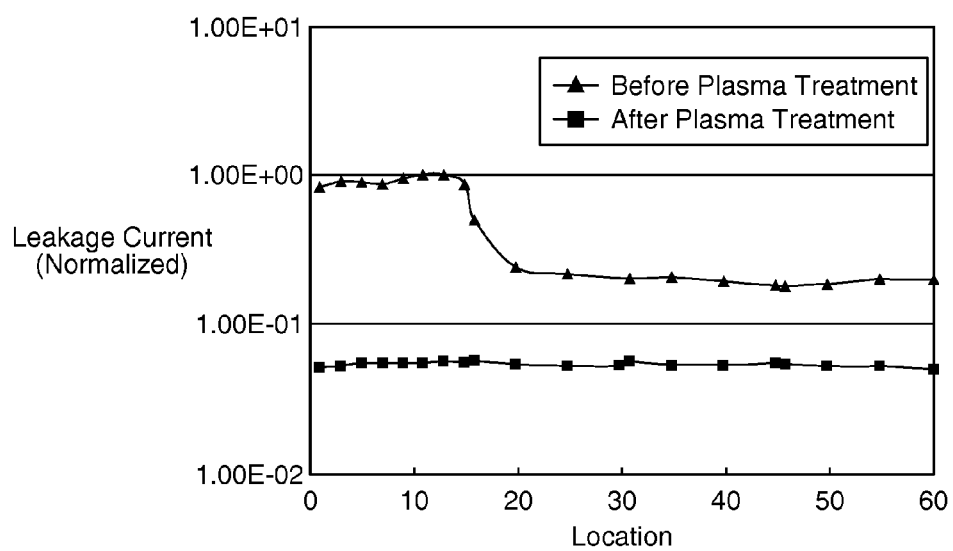
FIG. 11 is a graph showing results of measurement of leakage current.

FIG. 11 shows measurement results of leakage current values before and after the plasma treatment at different positions (places) within the substrate surface. The axis of abscissas in FIG. 11 indicates places within the substrate surface, corresponding to distances from the orientation flat. Along the axis of ordinates in FIG. 11 plots leakage currents measured at an application voltage of 20V, which are normalized with the maximum value of leakage current before the plasma treatment as being 1. It is observed from FIG. 11 that the distribution of leakage currents in the surface of the wafer existed before the plasma treatment is almost completely eliminated by the plasma treatment along the entire region inside the surface of the wafer. Also, it was found that the values of leakage currents were considerably reduced by the plasma treatment along the entire region inside the surface of the wafer.

Table 1 below shows experiment results of leakage currents measured while changing the conditions for the plasma treatment. In the result column in Table 1, when the leakage current is considerably reduced by the plasma treatment, the result is indicated by a mark ○; when there is no change in the leakage current, the result is indicated by a mark Δ; and when the leakage current is increased, the result is indicated by a mark ×. It is observed from Table 1 that favorable results are obtained when the RF bias is applied to the substrate side at low pressures regardless of the types of gases. Also, it is observed that the RF bias power at 50 W is effective enough to sufficiently cure the exposed surface of the dielectric layer 30. Also, it is observed that there is no change in the characteristics of the capacitor regardless of the pressure, when the RF bias is not present. When the RF bias is present, it is observed that the capacitor is damaged and the leakage current increases when the pressure is high, which is also shown in FIG. 9. In view of the above, it is found that a great damage recovery effect can be obtained by the plasma treatment when the RF bias is applied at lower pressures.

TABLE 1

| Type of Gas | Pressure Pa | Bias Power W | Time S | Result |
|---|---|---|---|---|
| $O_2$, Ar | 0.26 | 0 | 60 | Δ |
| $O_2$, Ar, $CF_4$, $BCl_3$, $C_4F_8$, $Cl_2$ | 0.26 | 50 | 10~20 | ○ |
| $O_2$, Ar | 0.26 | 450 | 10 | ○ |
| $O_2$, $N_2O$, $NF_3$ | 80 | 0 | 300 | Δ |
| $O_2$, $N_2O$, $NF_3$ | 80 | 200 | 10 | x |

1.2.2. Experimental Example 2

Figure 12:
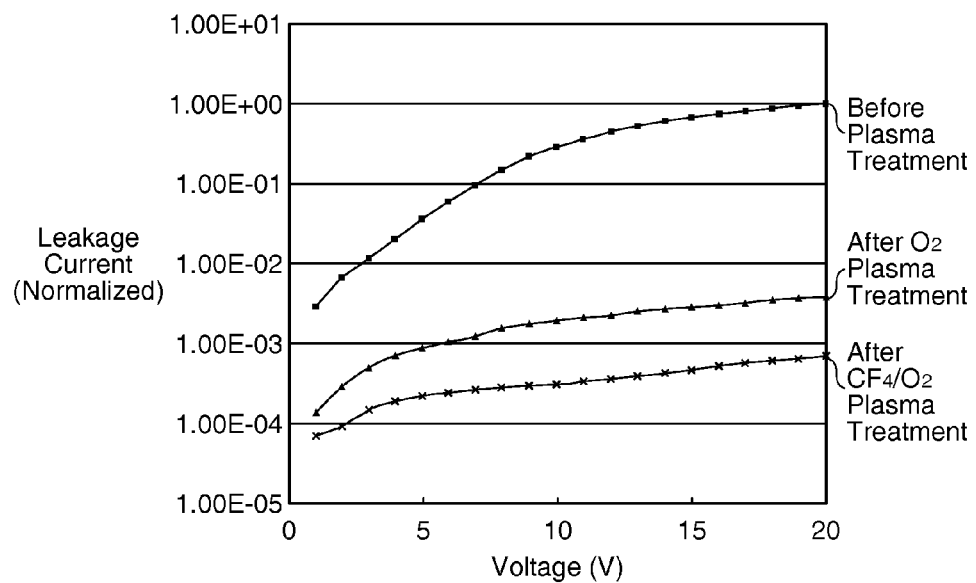
FIG. 12 is a graph showing results of measurement of leakage current.

FIG. 12 shows leakage current measurement results of capacitors having the structure shown in FIG. 7, before the plasma treatment, after the plasma treatment using oxygen gas, and after the plasma treatment using a mixed gas of oxygen and carbon tetrafluoride. Along the axis of ordinates in FIG. 12 plots leakage currents normalized with the value of leakage current of a capacitor before the plasma treatment measured at a voltage of 20V. Measurement voltages are plotted along the axis of abscissas in FIG. 12. It is observed from FIG. 12 that leakage currents of the capacitors treated with the plasma treatment using oxygen gas and the capacitors treated with the plasma treatment using the oxygen and carbon tetrafluoride mixed gas are both considerably reduced, compared to the capacitors before the plasma treatment. It is also found that the plasma treatment using the oxygen and carbon tetrafluoride mixed gas is more effective in reducing the leakage current than the plasma treatment using only oxygen gas.

It is noted that the damage recovering effect can be obtained by the plasma only using oxygen gas. However, depending on the film quality of the dielectric layer, the electrode material, and the condition for etching the dielectric layer, the damage recovering effect may not be perfectly attained, like the experimental example described above. In such a case, as is clear from FIG. 12, the use of plasma containing both of oxygen and fluorine (for example, plasma using a mixed gas of oxygen and carbon tetrafluoride) may result in more effective plasma treatment. The plasma treatment in this case may be conducted with 80% carbon tetrafluoride and 20% oxygen in the ratio of flow quantity, the pressure being 1.0 Pa, the RF bias power being 50 W, and the treatment time being 10 seconds. On the other hand, fluorine acts to chemically etch the dielectric layer and may therefore deteriorate the dielectric layer. However, fluorine may be mixed with a gas containing oxygen to generate plasma, and the plasma treatment may be conducted using this plasma, whereby the etching action of fluorine can be suppressed.

1.2.3. Experimental Example 3

Figure 13:
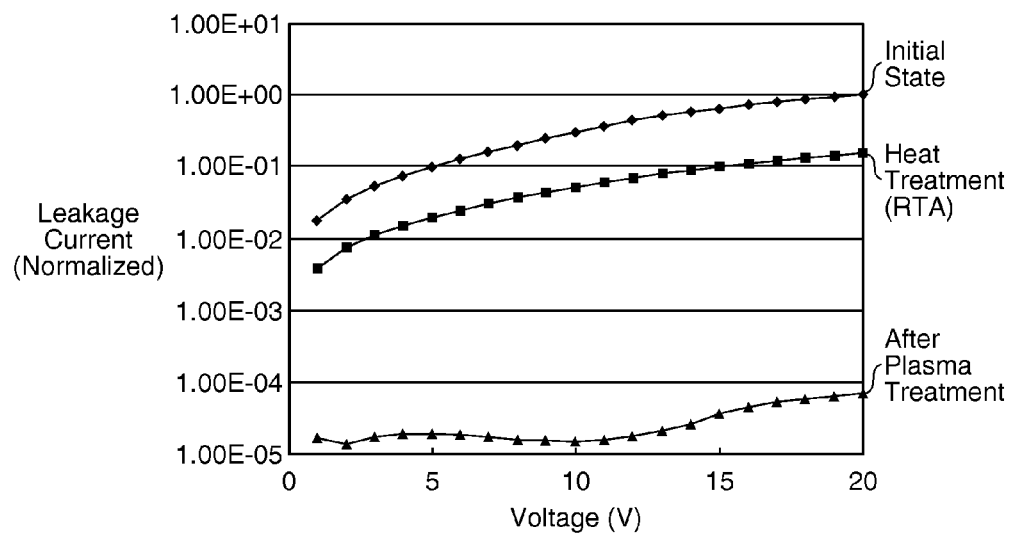
FIG. 13 is a graph showing results of measurement of leakage current.

Differences in the damage recovering mechanism were examined between the plasma treatment and a common heat treatment to be conducted for recovering damage on dielectric layers of capacitors. FIG. 13 shows measurement results of leakage currents of capacitors processed with the heat treatment as a damage recovering treatment, capacitors processed with the plasma treatment, and capacitors without any damage recovering treatment applied (indicated as "Initial State" in the figure). The axis of ordinates and the axis of abscissas similarly correspond to those in FIG. 12. As the capacitors before the damage recovering treatment (in the initial state), the capacitors to which considerable damage was forcefully inflicted by the plasma treatment with the pressure being 80 Pa shown in FIG. 9 were used. The heat treatment was conducted in an oxygen atmosphere at 600° C. for 5 minutes. The plasma treatment was conducted with the oxygen plasma at 0.26 P, the RF bias power being 50 W, and the treatment time being 10 seconds. It is clear from FIG. 13 that the damage inflicted on the exposed surface of the dielectric layer of the capacitor is recovered by the heat treatment in a leakage current value only in the level of about one digit thereof, but can be recovered by the plasma treatment in a leakage current value in the level of more than 4 digit thereof.

Figure 14:
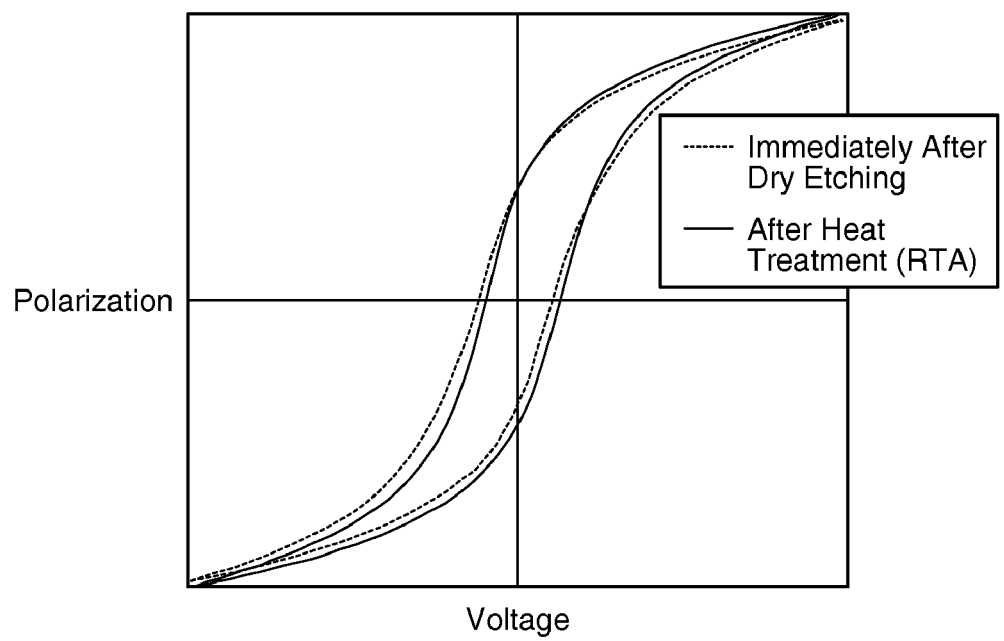
FIG. 14 is a graph showing results of measurement of hysteresis.

FIG. 14 shows a hysteresis loop of a capacitor immediately after the capacitor was formed by dry etching (in which a considerable damage shown in FIG. 13 was not inflicted), and a hysteresis loop of a capacitor to which a heat treatment (RTA treatment) was applied after the capacitor was formed. A hysteresis loop of a capacitor treated with the plasma treatment after forming the capacitor has the same shape as that of the hysteresis loop of the capacitor immediately after it was formed by dry etching, and therefore is not shown for the sake of convenience as the graph can be more clearly recognizable. It is observed from the graph that the heat treatment increases the remanent polarization (2Pr) by about 10%. On the other hand, it is found that the plasma treatment does not cause a considerable change in the hysteresis loop. Therefore it is found that the heat treatment or the plasma treatment alone does not completely cure the entire surface of the dielectric layer of the capacitor. In other words, it is found that the leakage current is effectively reduced particularly by the plasma treatment, and the shape of the hysteresis loop can be made better particularly by the heat treatment.

The method for manufacturing the capacitor 100 in accordance with the embodiment described above may be applied to, for example, methods for manufacturing liquid jet heads that may be used for ink jet printers and the like. Also, the method for manufacturing the capacitor 100 in accordance with the embodiment described above may be applied to methods for manufacturing memory elements that may be used in nonvolatile memories, for example.

2. Second Embodiment 2.1. Capacitor and Method for Manufacturing the Same

A method for manufacturing a capacitor in accordance with a second embodiment of the invention is described below with reference to FIGS. 15 to 21. FIGS. 15 to 21 are cross-sectional views schematically showing the steps of manufacturing the capacitor. The step of forming a silicon nitride layer 170 to be described below may be added to the present embodiment as a modified example.

Figure 15:
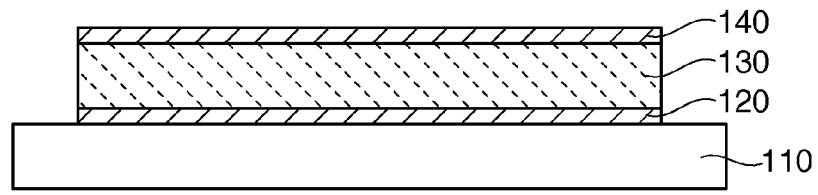
FIG. 15 is a schematic cross-sectional view showing a step of a manufacturing method in accordance with an embodiment of the invention.

The step of forming a lower electrode 120: First, a lower electrode 120 is formed on a base substrate 110 (FIG. 15). In the illustrated example, the base substrate 110 is prepared. As the base substrate 110 in accordance with the present embodiment, any arbitrary base substrate can be used. The lower electrode layer 120 may be formed by a known method. For example, the lower electrode 120 may be formed by a vapor deposition method, a sputter method, a plating method or the like. Also, the lower electrode may be patterned by a known method such as a photolithography technique.

The step of forming a dielectric layer 130: A dielectric layer 130 is formed above the lower electrode 120 (FIG. 15). In the illustrated example, the dielectric layer 130 is formed on and in contact with the lower electrode 120. The dielectric layer 130 may be formed by a known method. For example, the dielectric layer 130 may be formed by, for example, a sol-gel method, a CVD (chemical vapor deposition) method, and the like.

The step of forming an upper electrode 140: An upper electrode 140 is formed above the dielectric layer 130 (FIG. 15). In the illustrated example, the upper electrode 140 is formed on and in contact with the dielectric layer 130. The upper electrode 140 may be formed by a known method similar to the method for forming the lower electrode 120.

The upper electrode 140 and the lower electrode 120 may be formed by the same method or mutually different methods.

Figure 16:
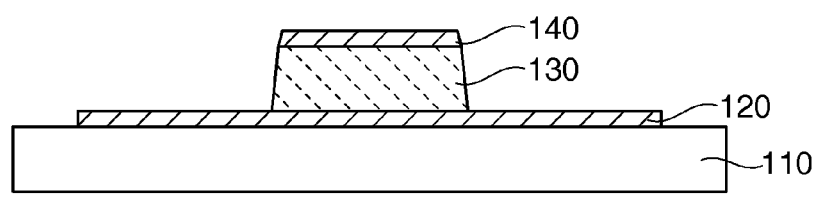
FIG. 16 is a schematic cross-sectional view showing a step of the manufacturing method in accordance with the embodiment of the invention.

The step of patterning the dielectric layer 130 and the upper electrode 140: Next, the dielectric layer 130 and the upper electrode 140 are patterned by a photolithography method (FIG. 16). For example, in this step, a mask layer (not shown) is formed on the upper electrode 140, and the upper electrode 140 and the dielectric layer 130 are etched. As the etching method, a known method such as a dry etching method and a wet etching method, and a combination of the aforementioned methods may be used. In the illustrated example, the upper electrode 140 and the dielectric layer 130 alone are etched. However, the lower electrode 120 may be further etched.

Figure 17:
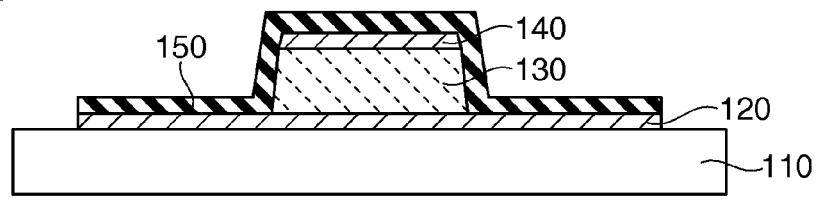
FIG. 17 is a schematic cross-sectional view showing a step of the manufacturing method in accordance with the embodiment of the invention.

The step of forming a first silicon oxide layer 150: A first silicon oxide layer 150 is formed in a manner to cover at least the side surface of the dielectric layer 130 (FIG. 17). The first silicon oxide layer 150 may be formed by a known method, such as, for example, a CVD method. For example, a film forming method that uses a CVD apparatus with trimethoxysilane (TMS) and tetraethoxysilane (TEOS) as source materials and $N_2O$ as an oxidizing agent may be used. As a specific example, in particular, a dual RF excitation plasma CVD method in which RF is applied to both of the plasma source side and the bias side may be used. As experimental conditions in this case, the power at the plasma source side may be set at 300 W, and the power at the bias side may be set at 300 W. In this instance, the first silicon oxide layer 150 may be formed to a film thickness of 10 nm to 40 nm. If the thickness of the first silicon oxide layer 150 is smaller than 10 nm, the effect to cover the side surface of the dielectric layer 130 cannot be obtained. If the thickness is greater than 40 nm, the effect of the succeeding step (the step of conducting a treatment with plasma containing oxygen) may not extend along the entire depth of the first silicon oxide layer 150 in its thickness direction, or to the interface between the first silicon oxide layer 150 and the dielectric layer 130 (to be described in greater detail).

Figure 18:
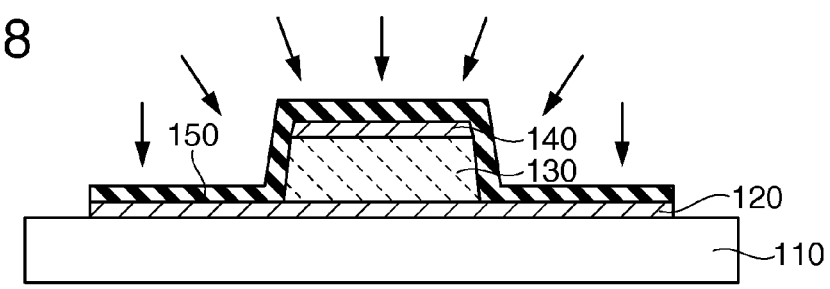
FIG. 18 is a schematic cross-sectional view showing a step of the manufacturing method in accordance with the embodiment of the invention.

The step of conducting a treatment with plasma containing oxygen: The present step is conducted to improve at least one of the film quality of the first silicon oxide layer 150 and the state of the interface between the first silicon oxide layer 150 and the dielectric layer 130. The plasma containing oxygen acts to supply oxygen to (oxidize) substance that is in contact with the oxygen. For this reason, impurities such as compounds containing hydrogen and carbon included in the first silicon oxide layer 150 are oxidized and removed by the plasma containing oxygen. Also, oxygen deficiencies at the interface between the first silicon oxide layer 150 and the dielectric layer 130 are also oxidized and repaired by the plasma containing oxygen. A conceptual diagram that shows plasma containing oxygen is in contact with the first silicon oxide layer 150 is shown in FIG. 18. Arrows in the figure represent plasma particles being irradiated toward the first silicon oxide layer 150.

The plasma containing oxygen may be plasma that contains oxygen atoms, and may be plasma generated by a single gas or a mixed gas of substance including $O_2$, $N_2O$, $CO_2$ and the like, or plasma generated by a mixed gas of the aforementioned substance and substance that does not contain oxygen such as $N_2$, Ar and the like. When the present step is conducted with plasma generated by gas containing nitrogen such as $N_2O$ gas, a mixture of $O_2$ and $N_2$ gas, a nitride such as silicon oxinitride ($SiO_xN_y$) and silicon nitride ($SiN_z$) can be generated in a region of about 5 nm deep from the surface of the first silicon oxide layer 150. As a result, impurities such as compounds containing hydrogen, water and carbon generated in the succeeding step (the step of forming a second silicon oxide layer 60) would be made more difficult to diffuse into the first silicon oxide layer 150.

The plasma may be generated by any known method without any particular limitation. As the conditions for the method, the pressure may be 60 Pa, the power may be 300 W at the plasma source side and 300 W at the bias side. In particular, by applying a power to the bias side, ions can be drawn in, such that oxidation can be effectively performed. When the first silicon oxide layer 150 is formed to a thickness of 10 nm to 40 nm, about 60 seconds is sufficient as the time duration for contacting with the plasma under the aforementioned conditions. If it is shorter than 20 seconds, the effect of the plasma may not extend along the entire depth of the first silicon oxide layer 150. The time duration for contacting with the plasma, if it is about 60 seconds or longer, can be optionally set through the manufacturing process design and the like. The present step can be conducted in the same apparatus where its preceding and succeeding steps are conducted.

Figure 19:
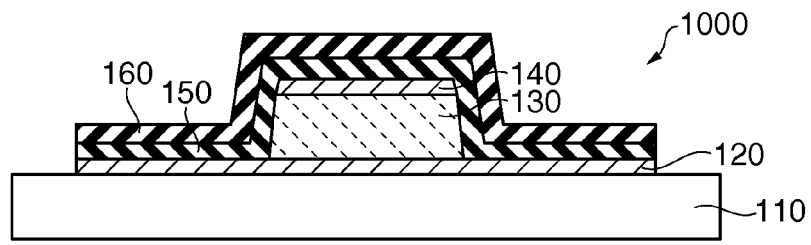
FIG. 19 is a schematic cross-sectional view of a capacitor obtained by the manufacturing method in accordance with the embodiment of the invention.
Figure 20:
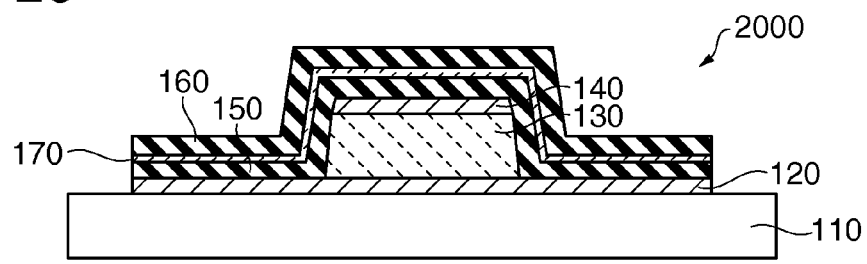
FIG. 20 is a schematic cross-sectional view of a capacitor obtained by the manufacturing method in accordance with the embodiment of the invention.
Figure 21:
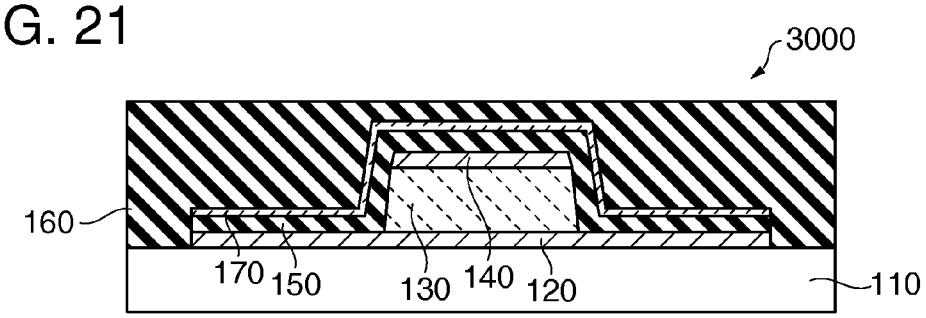
FIG. 21 is a schematic cross-sectional view of a capacitor obtained by the manufacturing method in accordance with the embodiment of the invention.

The step of forming a second silicon oxide layer 160: A second silicon oxide layer 160 is formed above at least the first silicon oxide layer 150 (FIGS. 19 to 21). The second silicon oxide layer 160 may be formed by a known method such as a CVD method. Also, the film forming method applied to forming the second silicon oxide layer 160 may be the same as or different form the film forming method applied to forming the first silicon oxide layer 150. For example, a film forming method that uses a dual RF plasma CVD apparatus with trimethoxysilane (TMS) as a source material and $N_2O$ as an oxidizing agent may be used.

The thickness of the second silicon oxide layer 160 may be, for example, 60 nm or greater. The thickness of the second silicon oxide layer 160 may be about 60 nm to 100 nm, in the case of capacitors of piezoelectric devices (for example, capacitors 1000 and 2000 exemplified in FIG. 19 and FIG. 20). In the case of capacitors of memory devices (for example, a capacitor 3000 exemplified in FIG. 21), the second silicon oxide layer 160 can be made thicker, as the second silicon oxide layer 160 can also function as an interlayer dielectric layer.

The step of forming a silicon nitride layer 170: A silicon nitride layer 170 may be formed above the first silicon oxide layer 150. In an example shown in FIG. 20 and FIG. 21, the silicon nitride layer 170 is formed directly on the first silicon oxide layer 150. This step may be added to the method for manufacturing a capacitor in accordance with the present embodiment as a modified example. The present step is conducted after the step of conducting a treatment with plasma containing oxygen, and before the step of forming the second silicon oxide layer 160. The silicon nitride layer 170 may be formed by a known method. For example, it can be formed by a CVD method. The thickness of the silicon nitride layer 170 may preferably be 1 nm to 50 nm. When the thickness is greater than this range, expansion and contraction of the dielectric layers may be restricted in the case of capacitors of piezoelectric devices. According to the manufacturing method of the present embodiment, by the step of conducting a treatment with plasma containing oxygen, at least one of the film quality of the first silicon oxide layer 150 and the interface state between the first silicon oxide layer 150 and the dielectric layer 130 is improved, and the leakage current that may be generated between the lower electrode 120 and the upper electrode 140 is suppressed.

Figure 25:
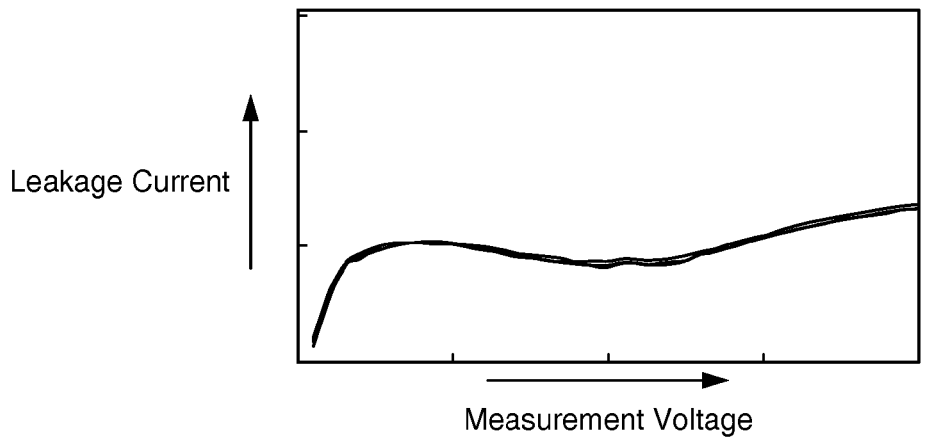
FIG. 25 is a graph showing results of measurement of leakage current.
Figure 26:
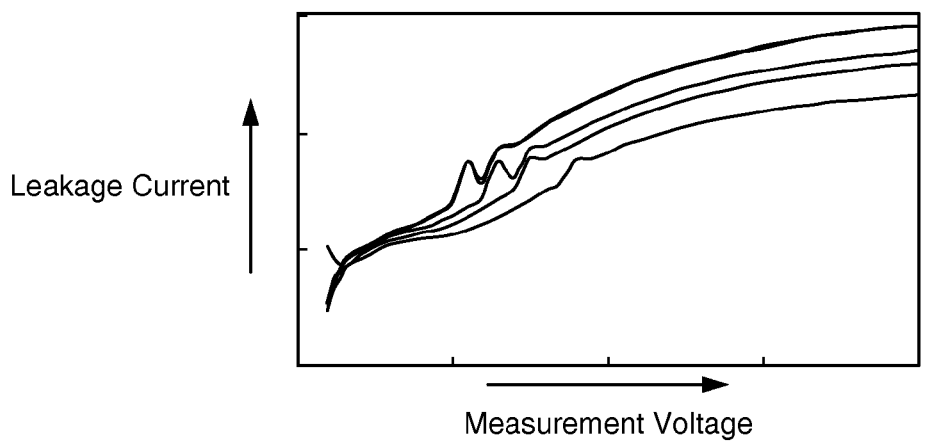
FIG. 26 is a graph showing results of measurement of leakage current.
Figure 27:
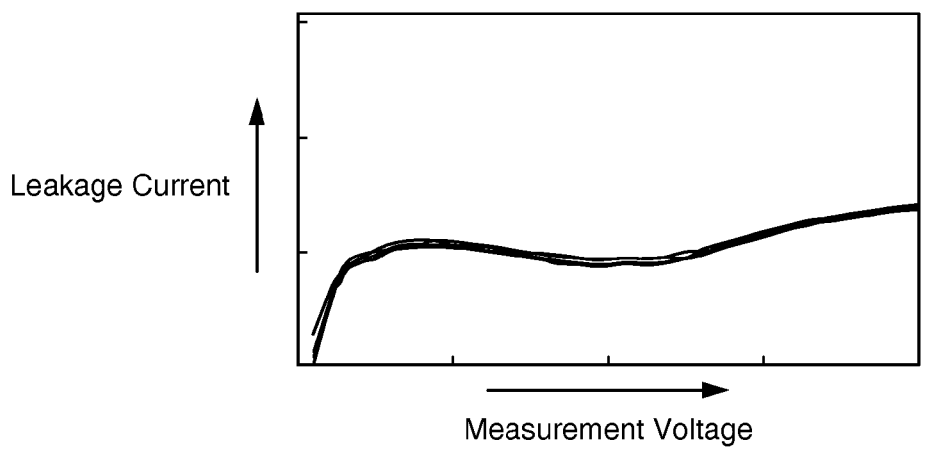
FIG. 27 is a graph showing results of measurement of leakage current.

The above can be supported by the experiment results shown in FIGS. 25 to 27. FIGS. 25 to 27 are graphs showing measurement results of leakage currents generated between the upper electrode 120 and the lower electrode 140. Voltages applied between the electrodes are plotted along the axis of abscissas of the graph, and leakage currents (in logarithm scale) are plotted along the axis of ordinates. Values along the axes of ordinates can be compared with one another as they are. FIG. 25 shows the results measured in an environment which is hard to be influenced by external impurities in a state in which the first silicon oxide layer 150 is not formed on the side surface of the dielectric layer 130 (the state in which the step of patterning the dielectric layer 130 and the upper electrode 140 has been conducted). FIG. 26 shows the results measured in a state in which the first silicon oxide layer 150 is formed by a CVD method using TMS on at least the side surface of the dielectric layer 130, and the second silicon oxide layer 160 is formed without conducting the treatment with plasma containing oxygen. FIG. 27 shows the results measured in a state in which the first silicon oxide layer 150 is formed on at least the side surface of the dielectric layer 130, the treatment with plasma containing oxygen is conducted, and then the second silicon oxide layer 160 is formed. It is noted that the number of lines (data) corresponds to the number of measured pieces (n number).

FIG. 25 shows favorable results, and it is preferable to approximate leakage currents to this result when the silicon oxide layer is formed. While leakage currents shown in FIG. 26 increase more than ten times, leakage currents shown in FIG. 27 indicate small favorable values like those shown in FIG. 25. In other words, it is observed from FIGS. 25 to 27 that the leakage currents in a state in which the silicon oxide layer is formed are suppressed by the treatment with plasma containing oxygen in accordance with the present embodiment. Also, because leakage currents are believed to be generated as they run along the side surface of the dielectric layer, it is believed that a region near the interface between the first silicon oxide layer 150 and the dielectric layer 130 has a structure that can reduce the leakage currents.

According to the steps described above, the capacitors 1000 to 6000 shown in FIGS. 19 to 24 can be fabricated.

Figure 22:
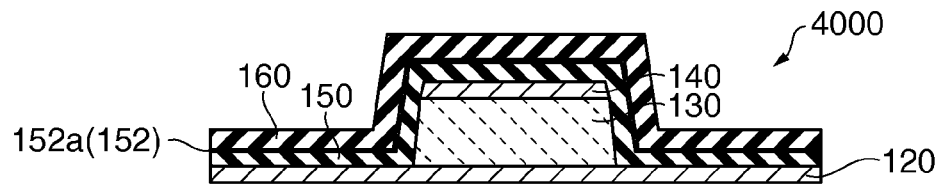
FIG. 22 is a schematic cross-sectional view of a capacitor obtained by the manufacturing method in accordance with the embodiment of the invention.
Figure 23:
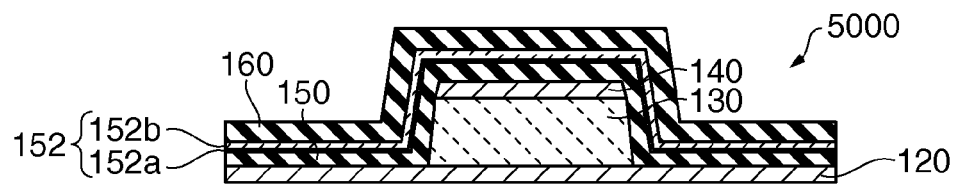
FIG. 23 is a schematic cross-sectional view of a capacitor obtained by the manufacturing method in accordance with the embodiment of the invention.
Figure 24:
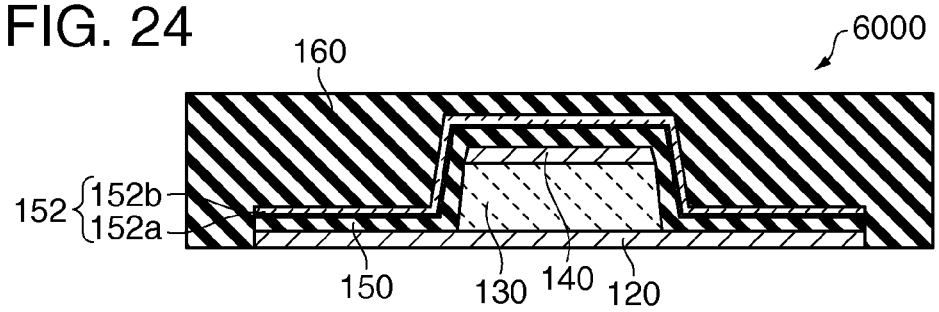
FIG. 24 is a schematic cross-sectional view of a capacitor obtained by the manufacturing method in accordance with the embodiment of the invention.

FIGS. 22 to 24 are schematic cross-sectional views of the capacitors 4000 to 6000 that are formed when plasma generated by gas containing nitrogen is used in the step of conducting the treatment with plasma containing oxygen described above.

Each of the capacitors 4000 to 6000 includes a lower electrode 120, a dielectric layer 130 composed of a ferroelectric or a piezoelectric provided above the lower electrode 120, an upper electrode 140 provided above the dielectric layer 130, a first silicon oxide layer 150 provided in a manner to cover at least the side surface of the dielectric layer 130, a nitride layer 152 provided above the first silicon oxide layer 150, and a second silicon oxide layer 160 provided above at least the nitride layer 152.

The lower electrode 120 is provided below the capacitor. The shape of the lower electrode 120 does not necessarily correspond to that of the dielectric layer 130. Also, the lower electrode 120 may have a shape corresponding to the shape of the dielectric layer 130, and may be patterned. The lower electrode 120 pairs with the upper electrode 140, and defines one of the pair of electrodes of the capacitor. Any material can be used for the lower electrode 120 as long as it has conductivity, and a metal such as gold, platinum, nickel or the like, an alloy of these metals, a conductive oxide film such as a film of $LaNiO_3$, or an amorphous silicon film may be used.

The dielectric layer 130 is provided above the lower electrode 120 and below the upper electrode 140 (see FIGS. 22 to 24). Another layer, such as, for example, a silicide layer may be provided between the dielectric layer 130 and the lower electrode 120. The shape of the dielectric layer 130 may or may not concur with the shape of the lower electrode 120. The dielectric layer 130 polarizes and depolarizes or expands and contracts by the action of electric fields generated between the lower electrode 120 and the upper electrode 140. When the dielectric layer 130 has polarization and depolarization, the capacitor can be used as, for example, a memory device such as a FeRAM. Also, when the dielectric layer 130 has expansion and contraction, the capacitor can be used as, for example, a piezoelectric device such as a liquid jet head.

The dielectric layer 130 may be composed of lead zirconate titanate (PZT) including Pb, Zr and Ti as constituent elements. Also, the dielectric layer 130 may be composed of lead zirconate titanate niobate (PZTN) in which Nb is further doped in PZT.

The upper electrode 140 is provided above the dielectric layer 130. The upper electrode 140 may be provided in a shape corresponding to the shape of the dielectric layer 130, as shown in FIGS. 22 to 24. Another layer such as a silicide layer may be provided between the upper electrode 140 and the dielectric layer 130. The upper electrode 140 pairs with the lower electrode 120 and defines one of the pair of electrodes of the capacitor. Any material can be used for the upper electrode 140 as long as it has conductivity, and a metal such as gold, platinum, nickel or the like, an alloy of these metals, a conductive oxide film such as a film of $LaNiO_3$, or an amorphous silicon film may be used.

The first silicon oxide layer 150 is provided in a manner to cover at least the side surface of the dielectric layer 130. In the examples shown in FIGS. 22 to 24, the first silicon oxide layer 150 is depicted in a continuous shape that covers the side surface of the dielectric layer 130, but can have a discontinuous shape having for example holes in portions other than the side surface of the dielectric layer 130, as long as it covers the side surface. The thickness of the first silicon oxide layer 150 may preferably be 10 nm to 40 nm. When the thickness of the first silicon oxide layer 150 is smaller than 10 nm, the effect to cover the side surface of the dielectric layer 130 cannot be obtained. If the thickness is greater than 40 nm, the effect of the step of conducting a treatment with plasma may not extend along the entire depth of the first silicon oxide layer 150 in its thickness direction. The first silicon oxide layer 150 may be provided to reduce leakage currents between the lower electrode 120 and the upper electrode 140 which occur near the side surface of the dielectric layer 130. Also, the first silicon oxide layer 150 also has a function to suppress diffusion of impurities such as compounds including hydrogen, water and carbon entering from outside into the dielectric layer 130.

The material for the first silicon oxide layer 150 is different from ordinary silicon oxide that may be formed by a CVD method using TES and TEOS, but silicon oxide that is formed from the aforementioned silicon oxide processed with an impurity reduction treatment. The ordinary silicon oxide formed by a CVD method using TES and TEOS contains substances such as compounds including hydrogen, water and carbon originated from its source materials. On the other hand, it is believed that the silicon oxide composing the first silicon oxide layer 150 in accordance with the present embodiment rarely contains substances such as compounds including hydrogen, water and carbon originated from its source materials, as it is treated with the above-described treatment with plasma containing hydrogen. By using such a material, a region near the interface between the first silicon oxide layer 150 and the dielectric layer 130 has a structure that can reduce leakage currents.

The nitride layer 152 may be in a single layer or a laminate of layers. FIG. 22 shows an example in which the nitride layer 152 is formed form a nitride layer 152a in a single layer, and FIGS. 23 and 24 show examples in which the nitride layer 152 is formed from a laminate of a nitride layer 152a and a nitride layer 152b. The nitride layer 152a is provided above the first silicon oxide layer 150 (see FIGS. 22 to 24). In the illustrated example, the nitride layer 152a is provided on and in contact with the first silicon oxide layer 150. The shape of the nitride layer 152a corresponds to the shape of the first silicon oxide layer 150. The thickness of the nitride layer 152a may be, for example, 2 nm to 5 nm. The nitride layer 152a may be provided through conducting the treatment step with plasma containing oxygen and nitrogen described above. The nitride layer 152a has a function to prevent impurities including hydrogen and water from diffusing from the second silicon oxide layer 160 provided above the nitride layer 152a into the first silicon oxide layer 150. Accordingly, the nitride layer 152a has an action to keep the amount of impurities contained in the first silicon oxide layer 150 at a small level. The material for the nitride layer 152a includes at least one of silicon nitride and silicon oxinitride.

As an example of the nitride layer 152 provided as a laminate, a laminate in which another nitride layer 152b is stacked on the nitride layer 152a, as shown in FIG. 23 and FIG. 24, may be enumerated. The shape of the nitride layer 152a and the nitride layer 152b correspond to the shape of the first silicon oxide layer 150. The material for the nitride layer 152b may be silicon nitride. The nitride layer 152b may be formed by the step of forming the silicon nitride layer 170 described above. The nitride layer 152b has a function to prevent impurities including hydrogen and water from diffusing from the second silicon oxide layer 160 provided above the nitride layer 152b into the nitride layer 152a and the first silicon oxide layer 150. In other words, the nitride layer 152b can enhance the function of the nitride layer 152.

The second silicon oxide layer 160 is provided above at least the nitride layer 152. The second silicon oxide layer 160 may be in the form of a thin film like those provided in the capacitors 4000 and 5000 exemplified in FIGS. 22 and 23, or may be provided in the form of an embedding layer as the one provided in the capacitor 6000 exemplified in FIG. 24. The thickness of the second silicon oxide layer 160 may preferably be, for example, 60 nm or greater in the case of the thin film shape. In the case of the embedding layer form, the second silicon oxide layer 160 may have a thickness that can secure the nonconductivity between the lower electrode 120 or the upper electrode 140 and another unshown conductive body.

2.2. Effect

According to the embodiments described above, by the plasma containing oxygen, impurities such as compounds containing hydrogen and carbon included in the first silicon oxide layer 150 and oxygen deficiencies at the interface between the first silicon oxide layer 150 and the dielectric layer 130 are removed. For this reason, the reduction of the inorganic oxide of the dielectric layer 130 is suppressed, and leakage current running on the side surface of the dielectric layer 130 can be made extremely small. Further, as the Young's modulus of the laminate of the first silicon oxide layer 150 and the second silicon oxide layer 160 is smaller compared to that of aluminum oxide, the capacitors 1000 to 5000 are obtained as favorable piezoelectric devices that do not obstruct extension and contraction of the dielectric layer 130. Also, as the step of conducting the treatment with plasma containing oxygen can be performed in a short time within the same chamber as used for the preceding and succeeding steps, the capacitors 1000 to 6000 with good quality can be obtained, while securing a desired throughput.

Also, by conducting the treatment with plasma containing oxygen and nitrogen, nitrides such as $SiO_xN_y$ and $SiN_z$ can be generated in a region of about 5 nm deep from the surface of the first silicon oxide layer 150. As a result, impurities such as compounds containing hydrogen, water and carbon generated when a silicon oxide layer is formed there above would be made more difficult to diffuse into the first silicon oxide layer 150.

By the effects described above, in accordance with the manufacturing method of the embodiments described above, the capacitors 1000 to 6000, which suppress reduction of inorganic oxide of the dielectric layer 130, have extremely small leakage current, are difficult to be affected by external impurities, and do not harm the characteristics of the dielectric layer 130, can be obtained. The capacitors 1000, 2000, 4000 and 5000 in accordance with the embodiment described above may be applied to, for example, liquid jet heads that are used in ink jet printers or the like. Furthermore, the capacitors 3000 and 6000 in accordance with the embodiment described above may be applied to, for example, memory elements that are used for nonvolatile memories.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A method for manufacturing a capacitor comprising the steps of:
   forming a lower electrode;
   forming a dielectric layer composed of a ferroelectric material or a piezoelectric material above the lower electrode;
   forming an upper electrode layer above the dielectric layer;
   patterning the dielectric layer and the upper electrode layer into a dielectric and an upper electrode using a mask;
   forming a first silicon oxide layer that covers a side surface of the dielectric;
   conducting a treatment with plasma containing oxygen; and
   forming a second silicon oxide layer above at least the first silicon oxide layer.

2. A method for manufacturing a capacitor according to claim 1, wherein the plasma containing oxygen further contains nitrogen.

3. A method for manufacturing a capacitor according to claim 1, comprising the step of forming a silicon nitride layer above the first silicon oxide layer after the step of conducting the plasma treatment, and before the step of forming the second silicon oxide layer.

4. The method of claim 1, wherein the first silicon oxide layer directly covers the side surface.

5. A capacitor comprising:
   a lower electrode;
   a dielectric layer composed of a ferroelectric or a piezoelectric provided above the lower electrode;
   an upper electrode provided above the dielectric layer;
   a first silicon oxide layer that covers at least a side surface of the dielectric layer;

a nitride layer provided above the first silicon oxide layer; and a second silicon oxide layer provided above at least the nitride layer.

6. A capacitor according to claim 5, further comprising another silicon nitride layer between the nitride layer and the second silicon oxide layer.

7. A capacitor according to claim 5, wherein the nitride layer includes at least one of silicon nitride and silicon oxinitride.

8. The capacitor of claim 5, wherein the first silicon oxide layer directly covers the side surface.

* * * * *